United States Patent
Gorbics

(10) Patent No.: US 7,466,247 B1
(45) Date of Patent: Dec. 16, 2008

(54) FRACTIONAL-DECIMATION SIGNAL PROCESSING

(75) Inventor: Mark S. Gorbics, Franklin Lakes, NJ (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 11/906,934

(22) Filed: Oct. 4, 2007

(51) Int. Cl.
*H03M 7/00* (2006.01)

(52) U.S. Cl. .................. 341/61; 341/123; 341/155; 708/313

(58) Field of Classification Search .............. 341/61, 341/155
See application file for complete search history.

(56) References Cited

U.S. PATENT DOCUMENTS

| | | | |
|---|---|---|---|
| 5,003,308 A | | 3/1991 | Furniss et al. |
| 6,081,216 A | * | 6/2000 | May .......................... 341/143 |
| 6,084,924 A | * | 7/2000 | Melas ......................... 375/340 |
| 6,272,193 B1 | | 8/2001 | Eglit |
| 6,430,240 B1 | | 8/2002 | Eglit |
| 6,539,318 B2 | | 3/2003 | Miller et al. |
| 6,549,595 B1 | | 4/2003 | Den Besten et al. |
| 6,668,292 B2 | | 12/2003 | Meyer et al. |
| 6,859,813 B2 | | 2/2005 | Gorbics et al. |
| 6,895,062 B1 | | 5/2005 | Wilson |
| 6,963,628 B2 | | 11/2005 | Boerstler |
| 6,999,544 B2 | | 2/2006 | Cranford, Jr. et al. |
| 7,088,767 B1 | | 8/2006 | Cory |
| 7,199,739 B2 | * | 4/2007 | May .......................... 341/143 |
| 7,236,110 B2 | * | 6/2007 | Antonesei ................... 341/61 |
| 7,365,671 B1 | * | 4/2008 | Anderson ................... 341/155 |
| 2008/0243406 A1 | | 10/2008 | Pupalaikis |

* cited by examiner

*Primary Examiner*—Khai M Nguyen
(74) *Attorney, Agent, or Firm*—Gordon Kessler

(57) ABSTRACT

Methods for processing waveforms may include decimating an over-sampled waveform by identifying samples for which the sample's position within a data period indicates that is closest to a selected time within a data period. In some example applications, the selected time may be determined as a preferred time to sample the waveform within a data period. In an illustrative example, a sequence of samples representing an over-sampled waveform may be reduced by identifying a sample in each data period that is closest in time to the selected time. In another illustrative example, a sample within each data period may be identified if it falls within a range that is a function of the selected time within the data period and an integral ratio of a sample period to the data period. The identified samples may be used to reconstruct the original waveform with fewer samples than the over-sampled waveform.

20 Claims, 6 Drawing Sheets

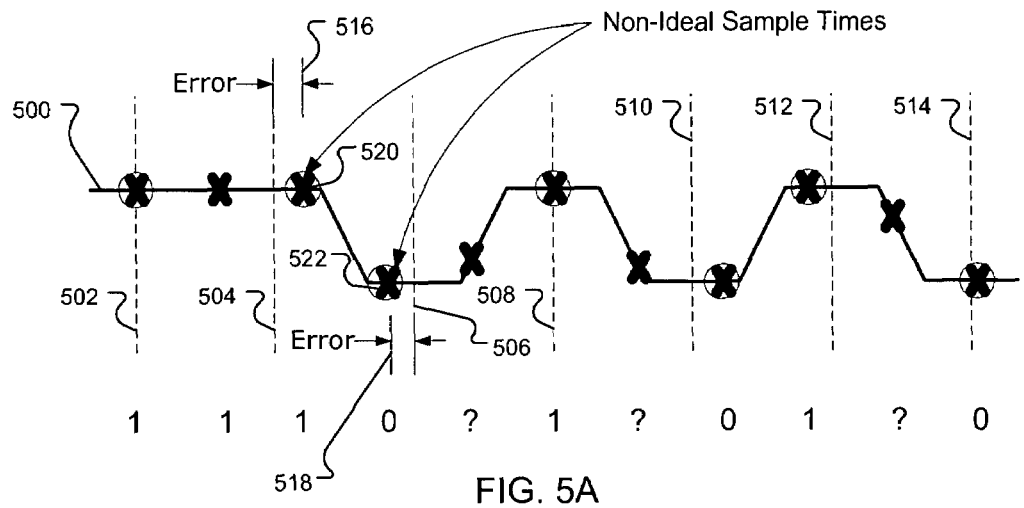
FIG. 5A
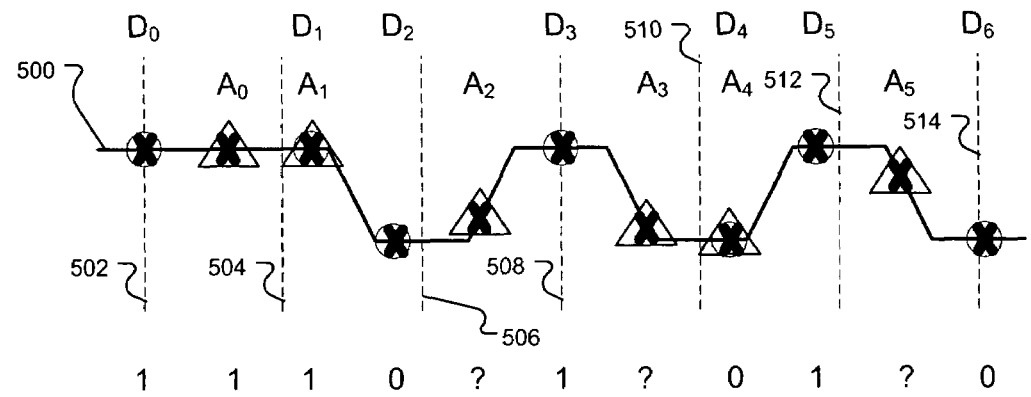
FIG. 5B
| N | S | P | Ps | OK1 | Dk | PD | OK2 | Ak | Ak+1 | Dk+1 | |
|---|---|---|---|---|---|---|---|---|---|---|---|
| 0 | 1 | 0.0 | 0.3 | √ | 1 | 0.8 | | | 1 | 1 | |
| 1 | 1 | 0.6 | 0.9 | | | 1.4 | √ | 1 | | | |
| 2 | 1 | 1.2 | 1.5 | √ | 1 | 2.0 | √ | 1 | 1 | 0 | Advance |
| 3 | 0 | 1.8 | 2.1 | √ | 0 | 2.6 | | | ?(=0) | 1 | Advance |
| 4 | ? | 2.4 | 2.7 | | | 3.2 | √ | ? | | | |
| 5 | 1 | 3.0 | 3.3 | √ | 1 | 3.8 | | | ?(=0) | 0 | Retard |
| 6 | ? | 3.6 | 3.9 | | | 4.4 | √ | ? | | | |
| 7 | 0 | 4.2 | 4.5 | √ | 0 | 5.0 | √ | 0 | 0 | 1 | Advance |
| 8 | 1 | 4.8 | 5.1 | √ | 1 | 5.6 | | | ?(=1) | 0 | Advance |
| 9 | ? | 5.4 | 5.7 | | | 6.2 | √ | ? | | | |
| 10 | 0 | 6.0 | 6.3 | √ | 0 | 6.8 | | | | | |
FIG. 5C

FRACTIONAL-DECIMATION SIGNAL PROCESSING

TECHNICAL FIELD

Various embodiments relate to processing waveform data acquired by sampling.

BACKGROUND

Digital processing of data may be applied in applications such as communications, control systems, audio processing, video data processing, and test and measurement, for example. In some cases, digital processing may involve digital filters that process sampled data acquired by an analog-to-digital converter (ADC). The sampled data may be processed by a digital signal processing (DSP) system, for example.

SUMMARY

Methods for processing waveforms may include decimating an over-sampled waveform by identifying samples for which the sample's position within a data period indicates that is closest to a selected time within a data period. In some example applications, the selected time may be determined as a preferred time to sample the waveform within a data period. In an illustrative example, a sequence of samples representing an over-sampled waveform may be reduced by identifying a sample in each data period that is closest in time to the selected time. In another illustrative example, a sample within each data period may be identified if it falls within a range that is a function of the selected time within the data period and an integral ratio of a sample period to the data period. The identified samples may be used to reconstruct the original waveform with fewer samples than the over-sampled waveform.

In some embodiments, the selected time within a data period of the input waveform may be approximately a center of the data period. The offset between the sample time and the selected time may be, for example, $E=1/(2*Fo)$, where Fo is the over-sampling factor. A sample closest in time to the selected time in the data period may be identified for each data period of the sampled waveform. In an illustrative example, samples to be retained after decimation may be identified based on an offset between a sample time and the selected time within the data period, which may be determined from a rational number that is a function of an over-sampling factor. In an illustrative example, the closest sample for a data period may be identified if a difference (in units of one data period) of the fractional portions of the times of the selected time and the sample time falls within one-half of the quotient of two integers representing a ratio of the data rate of the original waveform and the sample rate.

In some embodiments, identifying the sample closest to the selected time within each data period may include comparing a fractional portion of the sample time, in units of one data period, to a set of boundary conditions. The fractional portion may represent a location of the sample within the data period. A de-serializer may provide for parallel processing the fractional decimation.

In some embodiments, the original waveform is sampled using a substantially fixed-frequency clock source. In some embodiments, the fixed-frequency may be controlled to achieve a desired over-sampling ratio that substantially approximates a rational number (e.g., a number capable of being expressed as a quotient of integers), or reduces an excessive number of over-samples per data period. In some further embodiments, a phase of the input waveform may be tracked by evaluating the fractionally decimated outputs of two decimators that process the same input waveform data with a relative phase shift of 180 degrees.

Various embodiments may provide certain advantages. For example, some embodiments may be used to sample and decimate a wide range of input waveform frequencies using a substantially fixed sample rate. Some embodiments may substantially track the phase and/or frequency of the input waveform, and may further automatically determine data rate information for the input signal. Some embodiments may be configured to decimate by retaining a single sample for each data period of the input waveform, and may further advantageously identify a sample within each period that is substantially closest to an ideal sample point, which may be selected by a user. In some embodiments, fractional decimation may be used, for example, to convert a serial data stream from a first data rate to a second, reduced data rate.

Various illustrative embodiments are described in the accompanying drawings and the description below. Further features and advantages will be apparent from the description and drawings, and from the claims.

DESCRIPTION OF DRAWINGS

FIGS. 5A-5C illustrate exemplary sampling for fractional decimation.

DETAILED DESCRIPTION OF ILLUSTRATIVE EMBODIMENTS

Figure 1:
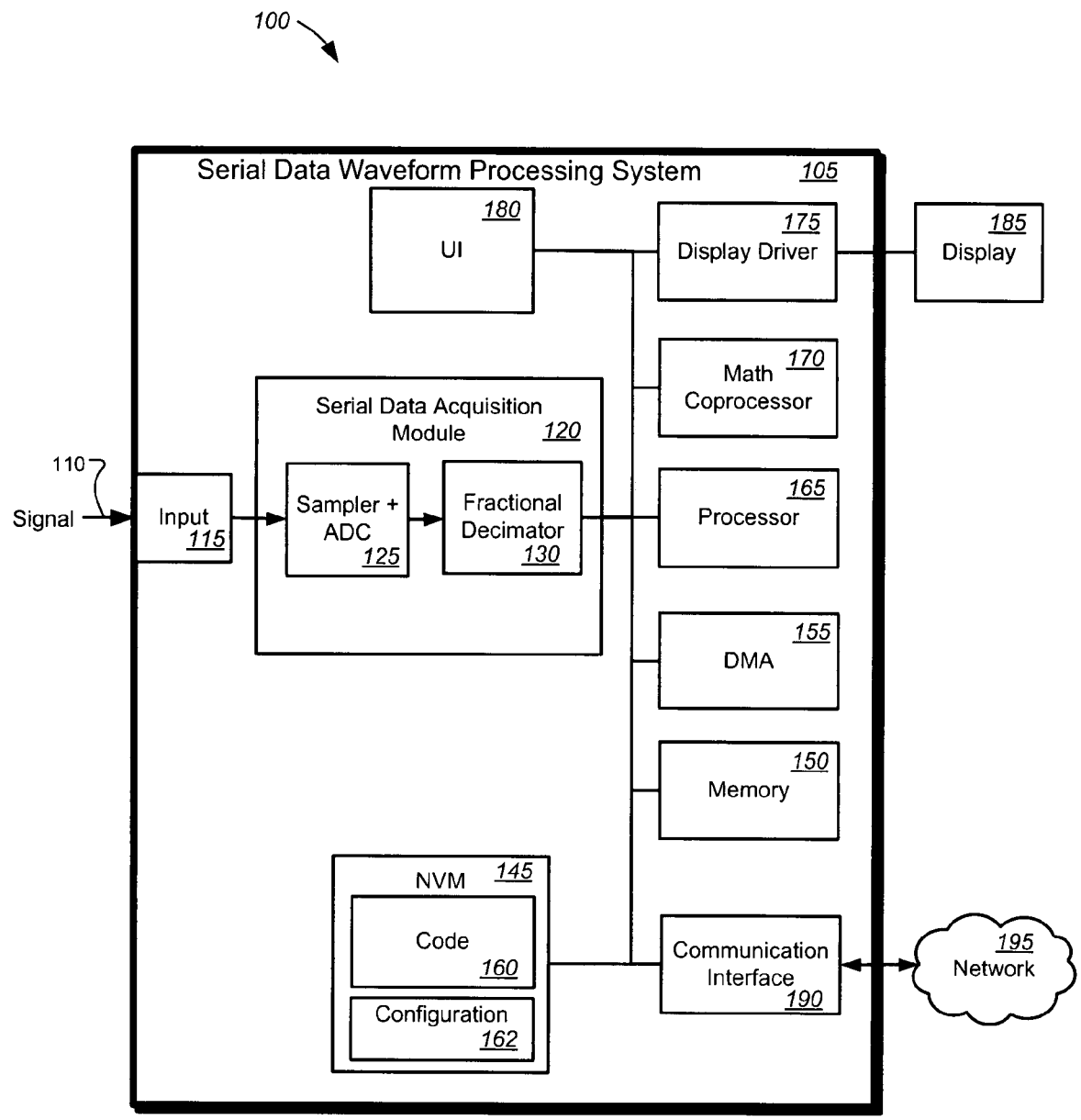
FIG. 1 is a block diagram of an exemplary waveform processing system with a fractional decimator.

FIG. 1 is a block diagram 100 of an exemplary waveform processing system 105 capable of using a fixed frequency clock to decimate over-sampled data of an input signal waveform, where the decimation factor may be selected as a rational number (e.g., quotient of integers). The samples selected to be retained after fractional decimation are those estimated to be the closest available samples to a selected (e.g., ideal) sample point, which may be, for example, a mid-point of a bit time of the input signal waveform.

In general, the waveform processing system 105 may receive data at a first data rate, and fractionally decimate the received data to generate an output signal at a second (e.g., lower) data rate. The first and second data rates may vary over a wide range of data rates, such as from near-DC up to about the sample rate used to sample an input signal waveform. In some embodiments, the waveform processing system 105 may receive serial data and process it for presentation on a display device with, for example, a fixed number of pixels. In some embodiments, the waveform processing system 105 may be used to adapt a serial communications bus that operates at one data rate to another serial communications bus that operates at another data rate. In some embodiments, the serial data waveform processing system may be reprogrammed to dynamically adapt to different inbound and outbound data rate requirements.

In the example depicted in FIG. 1, the waveform processing system 105 receives as an input signal 110, which may include a serial data waveform, through an input interface 115. The input interface 115 communicates the input signal 110 to a serial data acquisition module 120. In this example, the serial data acquisition module 120 may sample the input signal 110 for subsequent processing. In some embodiments, more than one period of a periodic input signal (e.g., a repetitive digital signal sequence) may be sampled. For example, the serial data acquisition module 120 may take numerous samples of each bit in a 64-bit long repeating pattern, and repeatedly acquire samples from the 64-bit pattern for several thousand cycles of the pattern. The serial data acquisition module 120 may acquire any practical number of samples for each bit, any pattern length, or cycles of the repeating pattern, subject to considerations such as effective sample rate, memory size, processing speed, system bandwidth, and/or accuracy specifications, for example.

The serial data acquisition module 120 includes a sampler and analog-to-digital converter (ADC) module 125 to convert the analog input signal 110 into digital samples for processing and/or storage. For example, the module 125 may digitize the amplitude of the input signal 110 over multiple sample periods. The serial data acquisition module 120 further includes a fractional decimator module 130. In some embodiments, the fractional decimator module 130 may decimate samples of the input signal by selecting certain samples for decimation based on the fractional part of a sampled data point's sample time offset. Examples of selecting samples for decimation are described in further detail with reference to FIGS. 5A-5C. The fractional decimator module 130, in some embodiments, may perform functions to convert a serial data waveform at one data rate into a serial data waveform at another data rate, and/or may perform functions related to tracking a phase of the input signal 10. Examples of processes that may be performed by the fractional decimation module 130 are described in further detail with reference, for example, to FIGS. 5A-5C.

The waveform processing system 105 of this example also includes a processor 165 and a math coprocessor 170. The processor 165 and/or coprocessor 170 may perform various functions, such as supervisory, user interface, signal processing, and/or signal analysis operations. For example, the processor 165 may supervise various operations, such as waveform data collection and user interaction. In various implementations, the math coprocessor 170 may include an ASIC (application specific integrated circuit), DSP (digital signal processor), discrete and/or integrated analog and/or digital circuits, a dedicated digital logic architecture to perform mathematics functions, or a combination of these or other circuits. The math coprocessor 170 may cooperate with the processor 165 to perform various functions. For example, the math coprocessor 170 may perform operations that include floating point arithmetic, signal processing, digital filtering (e.g., IIR, FIR) and/or numerical operations (e.g., curve fitting, numerical derivative computation, numerical integration, fast Fourier transformation (FFT), and interpolation). In various embodiments, the processors 165, 170 may cooperate to perform statistical analysis operations, such as computing the variance of a set of samples, for example.

In the depicted example, the processor 165 is coupled through a digital bus to memory devices, including a non-volatile memory (NVM) 145, a memory 150, and a Direct Memory Access (DMA) controller 155. The NVM 145 may provide a storage space for storing data (e.g., sampled waveform data acquired by the acquisition module 120) and/or executable instructions (e.g., application software). The NVM 145 may include, for example, flash memory, read only memory (ROM), EEPROM, data storage devices with rotating media (e.g., optical or magnetic disc drive), tape storage devices, or any combination of these or other data sources. The memory 150 may provide temporary storage for the sampled signal data from the serial data acquisition module 120. The memory 150 may be, for example, RAM, a buffer, or cache memory, for volatile data storage. In some embodiments, the processors 165, 170 may quickly access the memory 150 to retrieve and/or store data. In some embodiments, the memory 150 may also store intermediate results produced by the processor 165 and/or math coprocessor 170. For example, the memory 150 may store the data for portions of a waveform at a first and/or a second data rate (e.g., before and/or after fractional decimation), and or provide scratchpad memory for intermediate calculation parameters used in fractional decimating a waveform. The DMA 155 may handle accesses of the memory 150 without direct involvement of the processors 165, 170. For example, the DMA 155 can move data from one memory location to another memory location. In another example, the DMA 155 may be configured to move samples of the sampled input signal 110 from the serial data acquisition module 120 directly into sequential memory locations, such as an array in the memory 150 and/or the NVM 145, for subsequent analysis. In yet another example, the acquired waveform data may be sent directly to a buffer or a cache that is quickly accessible to at least one of the processors 165, 170.

Data caching and/or streaming may be used to improve processing efficiency by, for example, reducing calculation time for fractionally decimating an input waveform. In some embodiments, waveform, statistical analysis, and/or other processing operations performed by the waveform processing system 105 may use caching and/or data streaming techniques to improve data processing efficiency. In certain embodiments, streaming architectures may be used to facilitate data processing operations that may be performed according to serial data waveform processing methods described herein. Examples of streaming architectures are described in U.S. Pat. No. 6,539,318, "Streaming Architecture for Waveform Processing" to Miller et al., or U.S. Utility Application, "Temporally Aligned Waveform Processing," to Pupalaikis, filed on Oct. 3, 2007, the contents of each of which are incorporated by reference herein, although the present disclosure is not limited by either disclosure. Various streaming techniques may be applied in combination with other techniques, such as parallel processing and/or processing in hardware, for example.

In this example, the NVM 145 is coupled to the processor 165 by a digital address/data bus. The processor 165 may execute instructions and retrieve information stored in the NVM 145 via the bus. For example, the NVM 145 includes a code module 160 containing instructions that, when executed by the processor 165 and/or math coprocessor 170, may cause the processor to perform operations to fractionally decimate the signal 110. The NVM 145 may include a number of other code modules (not shown) to perform other operations, including operations in support of basic waveform processing system operations (e.g., user interface, boot-up, configurations). For example, one code module may compute an oversampling factor (Fo), or its substantial equivalent, based on information about the sample rate and the data rate. The data rate information may be received, for example, by direct measurement, user input, and/or other communication methods, such as chip-to-chip handshaking (e.g., rate selection). In various embodiments, the sample rate information may be fixed, or adjustable to a desired range as will be described with reference to FIG. 3. The NVM 145 also includes a configuration 162 that may contain settings (e.g., coded data) that the serial data acquisition module 120 may use to perform the serial data acquisition process (e.g., expected data rate of the serial data waveform signal 110, desired outbound data rate, the sampling rate for the module 125).

The waveform processing system 105 also includes a display driver 175 and a user interface 180. The display driver 175 may format and send images for display on a display device 185 in the user interface 180. For example, the display driver 175 can send for display samples of a serial data waveform so that an operator can view a representation that visually illustrates the measured input signal 110. An operator can use the user interface 180 to input commands and/or information to set-up and/or control operation of the serial data waveform processing system 105. In some embodiments, the operator may use the user interface 180 to input measurement set-up parameters. The set-up parameter may include, for example, number of periods of the input signal 110 to acquire, acquisition methods, trigger conditions, pattern length, and/or bit rate of the data pattern. In another example, the operator may use the user interface 180 to define and/or execute operations to process serial waveforms.

For example, the processor 165 can initiate the acquisition module 120 to sample the input signal 110 via the input interface 115. The acquisition module 120 can convert the analog input signal 110 into digital samples using the module 125 and store the digitized data in the memory 150. The processor 165 can then use the data to perform a serial data waveform processing operation. In the serial data waveform processing analysis operation, the processor 165 may instruct the math coprocessor 170 to perform one or more predefined data manipulation and/or numerical algorithm functions.

In some embodiments, the module 125 may treat the serial data waveform 110 as an analog signal, and digitize the serial data waveform signal 110 for use by the decimator module 130. The decimator module 130 may process digitized serial data waveform signal 110 to convert the serial data waveform signal 110 to a different data rate. In the example of serial data waveform processing system 105, the serial data waveform signal 110 is processed to allow a portion of the serial data waveform signal 110 to be displayed on the display 185. In various implementations, one or more processes of the fractional decimation may be performed in hardware (e.g., FPGA, ASIC, or a combination of these and/or other discrete and/or integrated analog and/or digital components), in software (e.g., firmware or the like), or in a combination of hardware and software.

In an illustrative example, a user may input a request to display a one-second period of the serial data waveform signal 110 that is being sampled at a 1 kHz rate, where the display 185 has only a horizontal resolution of 640 pixels. The code 160 may include instructions that, when executed by the processor 165, cause the processor 165 to perform operations to fractionally decimate the samples such that the samples remaining after decimation will fit on the display 185. In some embodiments, the fractional decimation operation may include computing averages, min-max values, or combinations of these or other post-processed values. Since the ratio of 1000 samples to 640 is not an integer ratio of pixels (e.g., a ratio of 1000/640=1.5625), fractional decimation may be used advantageously to generate for presentation representative data (e.g., without relatively unimportant samples, such as samples taken while the serial data waveform signal 110 was near or in transition from a low to high state or a high to low state) on the display 185.

In some embodiments, the fractional decimation process may be performed using a common processor module (e.g., the processor module 165 of the serial waveform processing system 105). Examples of fractional decimation operations are described in further detail with reference to FIG. 2.

In system 105, the digital bus is further coupled to a communication interface module 190. The communication interface module 190 communicates with a communications network 195. Serial waveform data that has been processed by the serial data acquisition module 120 may be sent, for example, to the communications network 195. The communication interface module 120 may send and/or receive data to monitor or control the serial waveform processing system 105 remotely from a node on the communications network 195.

The input interface 115 may include, for example, a connector, antenna, or detector (e.g., photo receiver) suitable to receive the input signal 110. In some applications, the signal 110 may be sensed by an active or passive probe coupled to a transmission line, wireless link, fiber optic waveguide, or other transmission channel or medium. The signal may be sensed, transported, and/or received using, for example, coaxial cable, microstrip, coplanar waveguides, waveguides, ribbon cable, shielded or unshielded twisted pair, optical fiber, antenna, photo-detector, printed circuits, or a combination of any of these or other similar apparatus. In various applications, the input signal 110 may originate from sources that may include, but are not limited to, a signal generator, analog and/or digital circuitry, transceivers (e.g., modem), wired or wireless or fiber optic communications equipment, or other sources.

Figure 2:
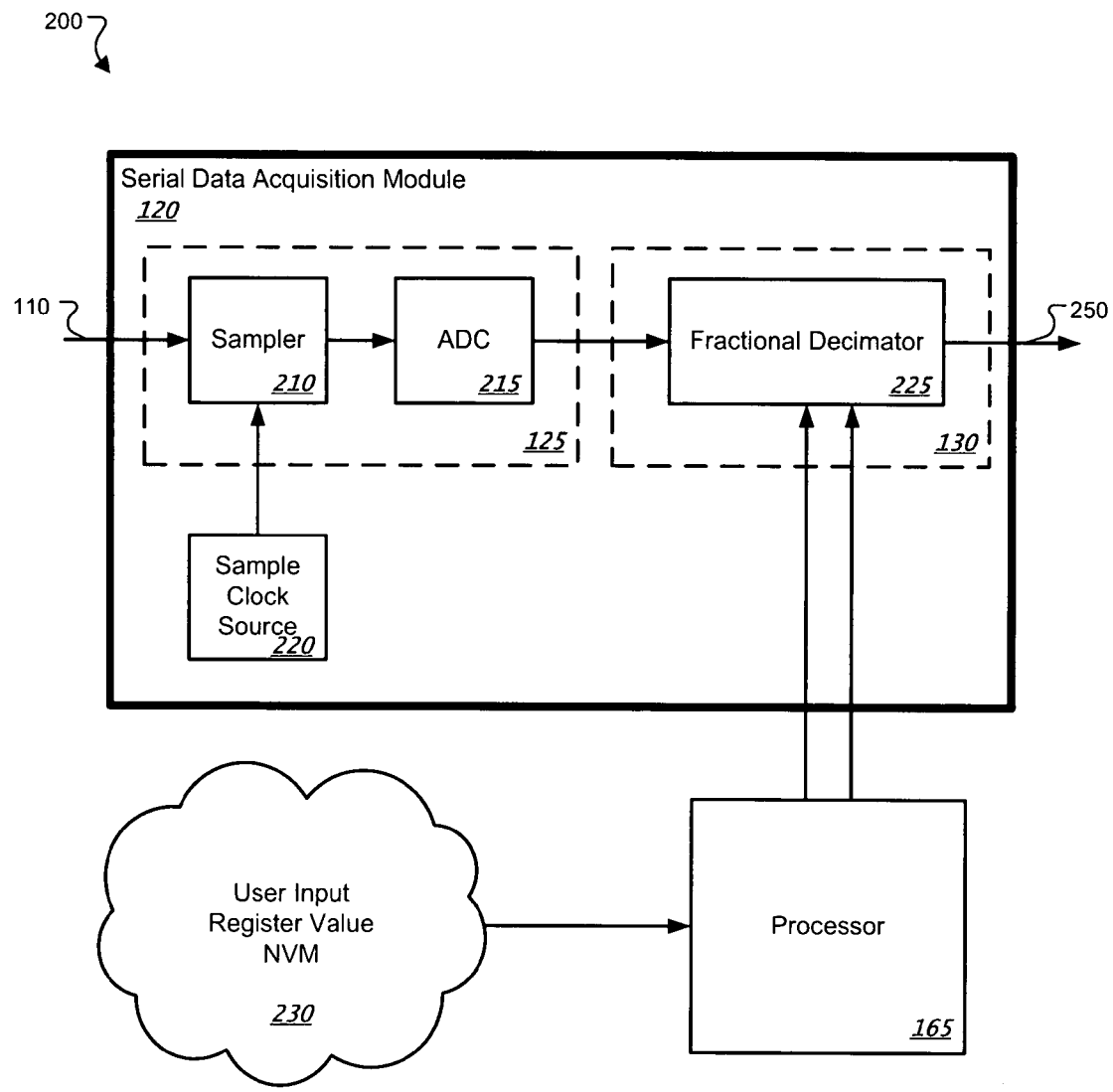
FIG. 2 is a block diagram of an exemplary serial data acquisition module with a fractional decimator.

FIG. 2 is a block diagram 200 shows an exemplary embodiment of the serial data acquisition module 120 of FIG. 1. In this example, the serial data waveform acquisition module 120 includes a sampler 210, an ADC 215, a sample clock source 220, and a fractional decimator module 225. In some embodiments, the sampler 210 may include a sample and hold, track and hold, or other sampling mechanism. In some examples, the clock source 220 may be a dedicated fixed-frequency clock source to generate a signal to establish, either directly or indirectly, the sample rate. The input signal 110 passes to the sampler 210 where the sample clock source 220 can trigger the sampler 210 to sample an analog voltage level of the input signal 110. The ADC 215 processes the sampled analog voltage level and converts the analog voltage to a digital representation.

The processor 165 passes configuration and/or control data to the fractional decimator module 225. The processor 165 may obtain and/or calculate the configuration data based upon a set of configuration data 230 received from user input, register values, NVM, or a combination of these or other data sources. The fractional decimator module 225 may use the configuration and/or control data from the processor 165 and the digital representation provided by ADC 215 to perform a fractional decimation process on the sampled data from the ADC 215. For example, the configuration and control data may include but is not limited to, for example, information related to sample period, data period, over-sampling ratio, phase information, and/or a selected time within the data period.

Such a selected time may be used to select samples to retain after decimation. For example, samples identified for retention for use in a reconstructing one period of a waveform may be identified as being closest to the selected time in the data period. In some implementations, the selected time within the period may be substantially in the center of the data period (e.g., positioned at 0.5 within a data period). In some implementations, the selected time period may be set to a time during a data period where the sample read by the analog-to-digital converter is most likely to be correct, for example near the end of a data period but before a transition or its related effects (e.g., ripple voltage in advance of a transition of a signal that has been digitally filtered) may become substantial.

The fractional decimation process creates a converted data stream 250. In various examples, the fractional decimator module 225 may convert a serial data waveform from one data rate to another data rate to create the converted data stream 250. Examples of such conversion processes are described in further detail with reference to FIGS. 5A-5C. In some embodiments, the converted data stream 250 may be sent to one or more modules for further processing, and/or the converted data stream 250 may be in communication with other devices that may use the converted data stream 250.

Figure 3:
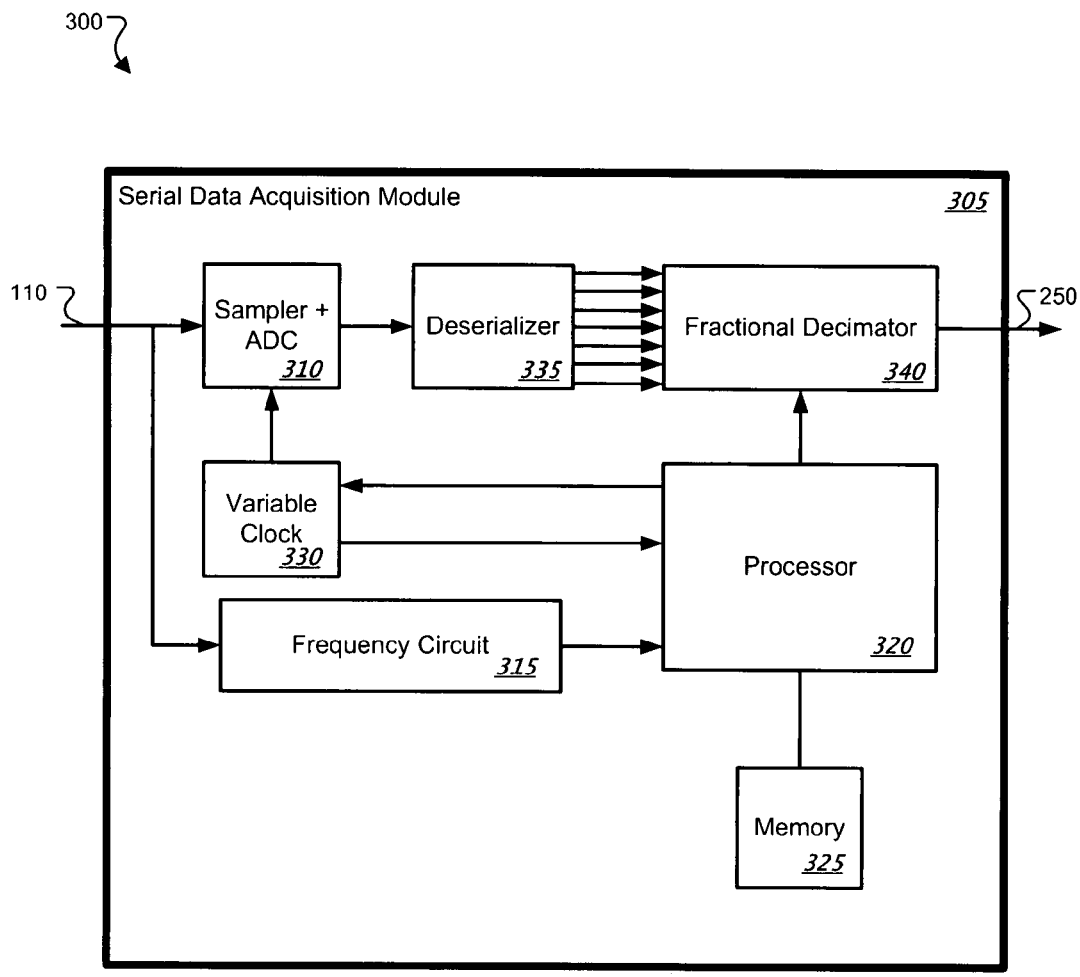
FIG. 3 is a block diagram of an exemplary of a serial data acquisition module for performing fractional decimation using multiple fractional decimators.

FIG. 3 is a block diagram 300 of an exemplary serial data acquisition module 305 that is capable of dynamically adapting to multiple serial waveform data rates. The module 305 of this example is further capable of de-serializing and fractionally decimating de-serialized waveforms in parallel.

The input signal 110 enters a sampler and ADC module 310 and a frequency circuit 315. The frequency circuit 315 determines the frequency of the data rate of the serial waveform data and passes the frequency data to an onboard processor module 320. A memory module 325 is also coupled to the onboard processor module 320. In some embodiments, the onboard processor module 320 may access the memory module 325 to load instructions that may be used in a fractional decimation process. The onboard processor module 320 uses the frequency data to configure a variable clock source 330. In some embodiments, the variable clock source 330 may be configured based upon the frequency of the serial waveform data. For example, the processor module 320 may adjust the variable clock source 330 to adjust the over-sampling ratio to a selected ratio, such as 2:1, 3:2, 4:3, 5:2, . . . , 100:71, 500:27, 1000:1, or more, for example. In various examples, the over-sampling ratio may be selected to be a rational number (e.g., ratio of two integers). Examples of such over-sampling processes are described in further detail with reference to FIG. 5.

The over-sampled data is provided to a de-serializer module 335. In some embodiments, the de-serializer module 335 may take the over-sampled data and distribute the data among two or more inputs to a parallel fractional decimator module 340. In some embodiments, the parallel fractional decimator module 340 may be able to perform a fractional decimation process faster by decimating two or more collections of serial waveform data samples in parallel. In some embodiments, the de-serializer module 335 may distribute the data among two or more discrete fractional decimator modules (e.g., the fractional decimator module 130) to perform a function similar to that of the parallel fractional decimator module 340. Examples of such fractional decimation processes are described in detail with reference to FIG. 5, and such parallel decimation processes are described in further detail with reference to FIG. 6. The fractional decimator 340 decimates the de-serialized serial data waveform samples to produce the converted data stream 250.

Figure 4:
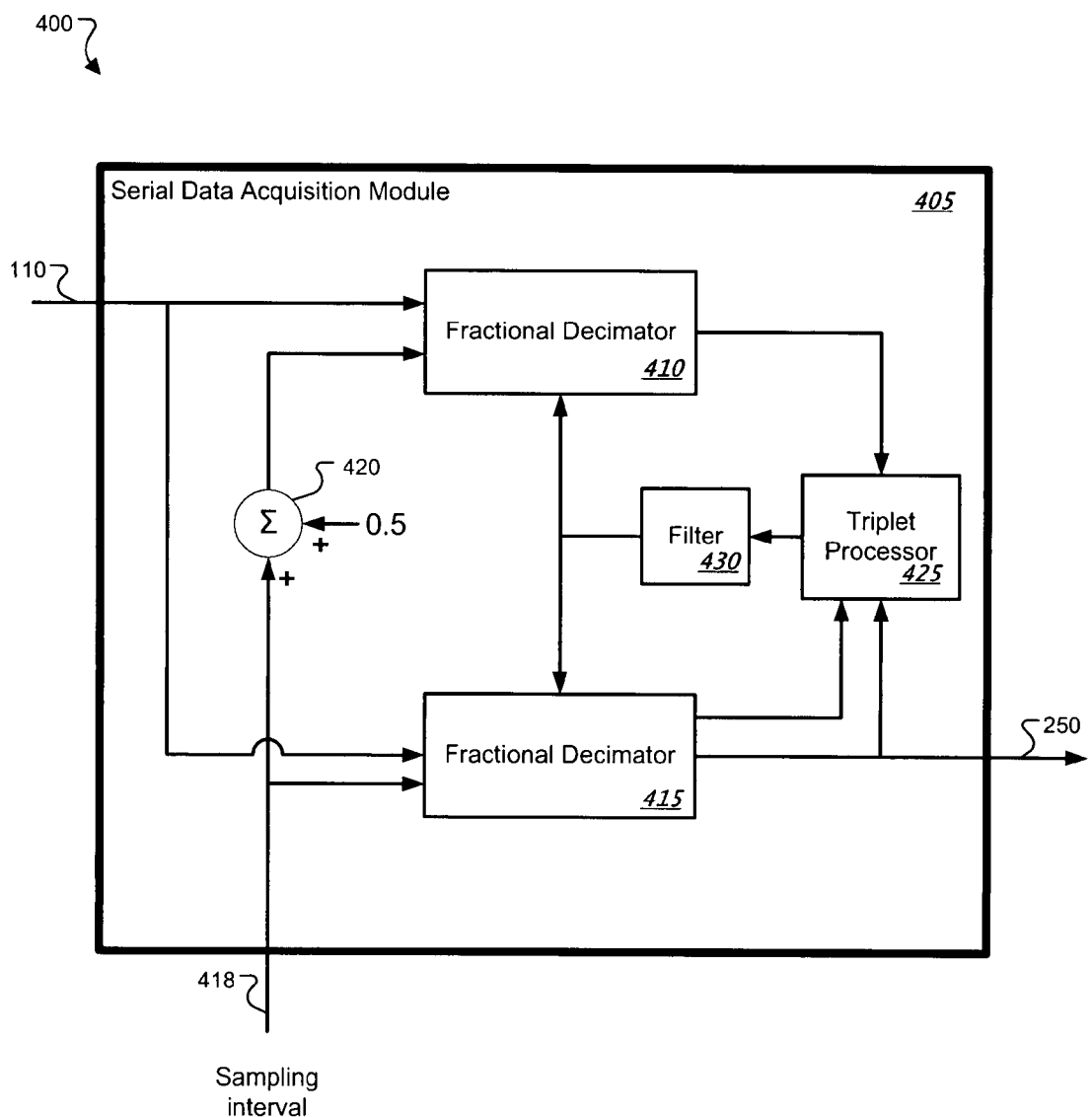
FIG. 4 is a block diagram of an exemplary serial data acquisition module that provides digital feedback to a fractional decimator.

FIG. 4 is a block diagram 400 of an exemplary serial data acquisition module 405 that is capable of controlling the phase of a fractional decimation circuit to follow the phase of an input serial data waveform. In various examples, a fractional decimation process may be substantially phase-locked to a serial data stream by operation of a second fractional decimation process being performed with a timing offset.

The serial data acquisition module 405 of this example includes a fractional decimator module 410 and a fractional decimator module 415. Fractional decimators 410 and 415 fractionally decimate the input signal 110, but the decimator 410 operates with a timing offset of one-half of a data period of the input signal 110. In operation, the fractional decimator module 410 may determine whether to advance or retard the decimation process of the fractional decimator module 415. A processor module (e.g., the processor 320) sends a sampling interval signal 418 to the fractional decimator module 415 to control the timing of the fractional decimation process. An offset module 420 creates a modified sampling input signal by introducing a timing offset substantially equal to one-half of a data period of the input signal 110. The offset module communicates the modified sampling interval signal to the fractional decimator module 410. The modified sampling interval signal configures the fractional decimator module 410 to decimate serial waveform data at points substantially 180 degrees out of phase with the fractional decimator 415. In some embodiments, this configuration may cause the fractional decimator module 410 to locate samples substantially proximate to the transitions of the input serial data waveform. In some embodiments, the decimator module 410 may identify the samples with the least amount of information about the data in the waveform. By comparing samples taken near the transition points with the samples taken by the fractional decimator module 415, the serial data acquisition module 405 determines whether to advance or retard the current phase of the decimation of the fractional decimator module 415.

In some embodiments, the samples taken by the fractional decimators 415 and the offset samples taken by the fractional decimator 410 may be used to determine a relative phase difference between a point at the center of a data period and a point in the data period where the fractional decimator 415 took a sample. The relative phase difference may be used to advance or retard the timing of the fractional decimators 410 and 415. By advancing or retarding the timing of the fractional decimators 410 and 415, the fractional decimation process may substantially track phase variations in the input signal. For example, for a data interval configured to sample data points for fractional decimation every 10 ms (e.g., samples taken at 0 ms, 10 ms, 20 ms, and so on), the offset module 420 may modify the sampling input signal 418 to cause the fractional decimator 410 to decimate samples offset by one-half of the data period (e.g., 5 ms, therefore samples would be taken at 5 ms, 15 ms, 25 ms, and so on). The fractional decimator 415 communicates a first and second data sample to a triplet processor 425. The fractional decimator module 410 passes a third data sample to the triplet processor 425. In some embodiments, the first and second data samples may be two sequential data samples, and the third data sample may be a data sample taken at a point substantially centered between the points where the first and second data samples were taken. For example, the fractional decimator module 410 may take a first data sample at 10 ms and a second data sample at 20 ms, and the fractional decimator module 415 may take a third data sample at 15 ms. The fractional decimator modules 410 and 415 may then send the first, second, and third data samples to the triplet processor 425. In some embodiments, the first, second, and third data samples form a data triplet that the triplet processor 425 may use to determine whether to advance or retard the phase of the sampling. In some embodiments, the phase locking process may allow the decimation to track the phase of the input signal 110. In some embodiments, the phase locking process may allow the input data rate to be determined directly from the input signal 110. Examples of such phase locking processes are discussed in detail with reference to FIGS. 5B and 5C. In some embodiments, a stream of data made up of samples from the first or second data samples of the fractional decimator 415 may form the converted data stream 250.

The triplet processor sends a phase adjustment signal to a filter 430. In some implementations, variable factors (e.g., sampling rates, phase offsets) may cause the data samples to form data triplets that may induce "jitter" in the phase adjustment signal. For example, a collection of data samples taken with the same phase and sampling rate may be used to produce a number of data triplets, and some of the data triplets may cause the triplet processor 425 to indicate that a phase advance may be needed while the rest of the data triplets may indicate that a phase retard is needed. In some embodiments, the filter 430 may be used to dampen the response of the phase adjustment and determine a filtered phase adjustment signal. For example, the triplet processor may send four non-identical phase adjustment signals (e.g., "advance", "advance", "retard", "advance"), and the filter 430 may determine a majority of the phase adjustment signals (e.g., 3 out of 4 signals indicated to "advance"). In some embodiments, the filter 430 may filter the phase adjustment signals by computing a mean, a median, a mode, a moving average, or by other means by which a series of data values may be filtered, or combinations thereof. The filtered phase adjustment signal is sent to the fractional decimator modules 410 and 415. In some embodiments, the fractional decimator modules 410 and 415 may use the filtered phase adjustment signal to adjust the phase of where the data samples are taken.

FIGS. 5A-5C illustrate examples of an exemplary serial waveform 500, sampling intervals, sample locations, and a table that illustrates how these samples may be used in an exemplary fractional decimation process. FIG. 5A and FIG. 5B illustrate an exemplary serial data waveform. Vertical lines across FIGS. 5A and 5B represent intervals spaced one data period apart and located substantially at the center of the period of each bit time of the serial data waveform. In this example, the center of the period represents a substantially optimal time to sample the waveform, although that is not a limitation of this approach. Sampled points taken are designated on the waveform by the symbol "X." Sampled values determined to be equal to 1 are represented at the bottom of the graph by a value of 1. Sampled values determined to be equal to zero are represented at the bottom of the graph by a value of zero. Samples taken during transitions are represented on the bottom of the graph by an indeterminate value of "?". In some embodiments, the serial data stream may be substantially over-sampled (e.g., at the highest available rate) and then digitally decimated to a desired output rate. In some implementations, digital feedback logic may control a phase of the decimation to substantially track or in response to a phase of the input signal.

FIG. 5A shows the exemplary serial data waveform 500, with source data points 502, 504, 506, 508, 510, 512, and 514 positioned substantially in the center of each data period of the waveform 500. In the depicted example, the serial data waveform 500 is over-sampled by a factor of 5/3. At least some of the sample times are not substantially at the source data points 502-514 on the waveform 500. For ease of illustration, the tracking of the waveform 500 has been disabled by providing a substantially fixed-frequency sample clock, although various embodiments are not so limited. The samples (depicted by "x" in the figures) of the resulting data stream are offset relative to the source data points 502-514. Accordingly, some of the samples have indeterminate logic values (represented at the bottom of the graph by the value "?"). Indeterminate data bits represented in the FIG. 5A by the value of "?" could potentially be interpreted to be a one or zero. In accordance with various embodiments, the probable value of these bits may be considered to be related to the waveform 500 at the sample point. For example, the probable value for the last indeterminate sample in FIG. 5A is more likely to be interpreted as a logic high level than logic low level because its voltage is closer to the high voltage level than the low voltage level.

FIG. 5A also illustrates a sample time error 516 and a sample time error 518. In the illustrated example, the serial data waveform 500 is over-sampled by a factor of 5/3, thus the sampling period is 3/5ths (0.6) of the data period. In this example, both of the samples 520, 522 are offset by 0.3 of a data period from the source data points 504, 506. In general, for samples that are spaced 0.6 of a data period apart, the sample closest to a selected point (e.g., center) of a data period will be offset up to 0.3 of a data period from the selected point of the data period.

The maximum offset (or error) from a selected reference time (e.g., center of sample period, ideal sampling time, or the like) within a data period is given by $E=1/(2*F_o)$, where E is the error and $F_o$ is the over-sampling factor. The over-sampling factor is determined as a ratio of the sample rate to the data bit rate of a serial waveform. Although the (5/3) over-sampling factor is used to illustrate various depicted examples for ease of understanding, that is not limiting and other over-sampling ratios may be used. Some embodiments may dynamically update a selection range (e.g., $E=1/(2*Fo)$) around the reference time to account for variations in a data rate of the incoming serial data stream. Adjustment of the selection range adjusts the boundary criteria for identifying a sample closest to the reference time.

In some embodiments, post-processing may be used to fractionally decimate the over-sampled data stream to digitally extract the original data stream at a lower bit rate. The processor (e.g., digital logic) that performs this extraction may operate at a clock frequency well below that of the original data stream bit rate.

In some examples, the process of recovering the original digital data stream may involve decimation of samples of data. Examples of integer decimation are described in U.S. Pat. No. 6,859,813, entitled "Parallel decimation circuits," by Gorbics, M., et al., the detailed description and figures of which are incorporated herein by reference. Fractional decimation extends the decimation factor to rational numbers (e.g., quotient of integers, a fraction). In various implementations, fractional decimation processing may identify, select and retain samples that are determined to be closest to the source data points (e.g., the points 502-514), in accordance with the techniques described in the various embodiments.

Information that describes the samples taken from the serial data waveform 500 of FIG. 5A is shown in a table 550 illustrated by FIG. 5C. A column with the header "N" includes the sample numbers. A column with the header "S" includes the sample values, and specifically amplitude values as determined by an analog-to-digital conversion process, which may include, but is not limited to, a single or multi-level threshold comparator with or without hysteresis, analog filter components, digital filtering (e.g., IIR, FIR), n-bit analog-to-digital conversion, or a combination of these or other elements to determine a logic level (e.g., binary, trinary, etc. . . . ) of a sampled data point of a waveform. A column with the header "P" includes the positions of the samples in units of data periods.

The positions in the "P" column have both an integer portion and a fractional portion. The integer portion represents the specific data period in which the sample falls. The fractional portion represents where in that particular data period the sample falls.

In this example, Fo=5/3, and E=1/(2*Fo), so the maximum offset, or E, is 0.3. In addition, the selected reference time in each period is the center of each data period (e.g., the source data points 502-514), and the initial sample (N=0) coincides with the source data point 502.

Any sample that is within E=0.3 of the center of a data period is recorded with a check mark in column OK1 in the table 550. Check marks have been entered in rows that contain samples where the fractional part of the position (in column P) is less than "E" away from one of the source data points 502-514. This condition is identified by using boundary criteria to select and check mark each row in which the fractional part of P is either less than 0.3 or greater than or equal to 0.7. To account for the possibility that two samples are equidistant (e.g., 0.3 offset) on both sides of a source data point, only one of the boundary criterion includes equality. In some embodiments, the lower boundary condition may include equality instead of the upper boundary condition.

In some embodiments, the check-marked samples may be used to recover the original data stream. The samples that are not selected for check-marking may be removed to form the reduced bit rate data stream. It is understood that the check-marks are presented to facilitate explanation to the reader. In various automated and/or electronic implementations, fractional decimation processing need not involve generating or storing check marks. One of ordinary skill in the art will understand various techniques for selecting sampled data that meet established criteria, and for distinguishing the selected samples from samples that do not meet the established criteria. Such processing may involve, but is not limited to, setting bit flags, copy, overwrite, delete, move and/or transfer operations in memory (e.g., cache, buffer, stack, RAM, or the like), database field entries, or a combination of these or other data handling techniques.

In some examples, the over-sampling factor may be a rational number. For example, the hardware may compute a substantially accurate position of samples, and rounding errors may cause two samples to be selected for the same ideal sample point. In some examples, numbers can be approximated with a rational number. In some implementations, the denominator may have a power of two that may advantageously simplify numerical representation and/or processing.

The fractional part of the number P, which may be designated as f(P), can represent the difference in timing between the sample and one of the ideal sample points 502-514.

In some implementations, computations with respect to boundary conditions may be advantageously simplified by shifting an arbitrary reference point. For example, boundary criteria as described above (f(P)<E) OR (f(P)=>(1−E)) may be simplified by adding "E" to the initial position of the first sample, and the comparison may be rewritten as (f(P)<2E) OR (f(P)>=(1.0). Since the exemplary comparison uses only the fractional part of the values, the boundary conditions may be rewritten as (f(P)<2E) OR (f(P)>=(0)), or simply (f(P)<2E). For example, when an over-sampling factor F=5/3 is used, E=0.3 and the boundary conditions (f(P)<0.3) OR (f(P) >=0.7), may be simplified to f(P)<0.6. With reference to the table 550, P values shifted by E=0.3 are represented in a column labeled "$P_s$." Applying the simplified boundary condition f(P)<0.6 yields the same result in column OK1 as previously determined with unshifted values compared to high and low boundary conditions. The integer part of the Ps value may directly indicate which of the data periods in the data stream the sample represents.

FIGS. 5B and 5C illustrate an exemplary digital feedback system to perform an exemplary phase tracking process for controlling the phase of the decimation circuit to substantially track the phase of the waveform 500.

In some embodiments, a second decimation circuit (e.g., the fractional decimator module 410) may be configured to sample offset samples of data at points with a phase of 180 degrees (e.g., one half of the period between two adjacent sample points of the source data points 502-514) different from sample points sampled by a first decimation circuit (e.g., the fractional decimator module 415). In some embodiments, the second decimation circuit may be implemented to sample data samples that are substantially close to the transitions of the serial data waveform 500. Data samples taken by the first and second decimation circuits may be used to determine if an adjustment may be made to advance or retard the current phase of the decimation.

The table 550 shows the second decimation by advancing the position "P" by one-half of a data period (e.g., 0.5) and re-computing the selected samples. FIG. 5B illustrates the offset samples used by the second decimation circuit with triangles. The offset samples, illustrated in the table 550 and designated by the column "$A_k$," are compared to the data samples used by the first decimation circuit. In some examples, a triplet of data samples may be formed with data samples "$D_k$," "$A_{k+1}$," and "$D_{k+1}$." A value of one or zero is assigned for the samples represented by "?" according to each sample's position on the waveform (e.g., "?" values are rounded to values of 0 or 1). In some examples, triplets that occur where the serial data waveform 500 transitions (e.g., high to low, low to high) may provide an indication of how to improve the phase of the fractional decimation. In some examples, triplets of "110" and "001" may indicate that the phase of the decimation should be advanced, and the triplets "100" and "011" may indicate that the phase should be retarded. In some examples, the resolution of '?' values and results may be determined by a statistical process. Four of the five exemplary cases illustrated in table 550 indicate that the phase of the decimation should be advanced. In some examples, the ⅘ths majority of "advance" indications may cause the decimation process to advance its phase, and an advancement of phase may more accurately align the samples with the data periods.

FIGS. 6A-6D illustrate a table 602, a table 604, a table 606, and a table 608, that hold data for an exemplary parallel decimation process. In some embodiments, it may be necessary to process serial waveform data faster than the sample rate. In some embodiments, the rate at which fractional decimation may be performed may be increased by performing two or more decimation calculations in parallel. For example, a module used for sampling data (e.g., the sample and ADC module 310 of FIG. 3) may be able to process data at a rate that is 4 times faster than the rate a single fractional decimator can process data. In this example, four or more fractional decimators may be implemented in a substantially parallel configuration, and in this exemplary manner the total data rate for decimating fractional data may be increased to substantially match the data rate of the module 310.

Figure 6A:
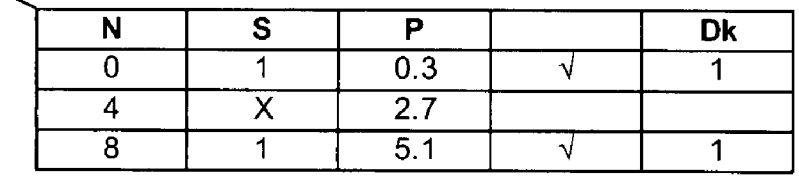
FIGS. 6A-6D are tables to illustrate an exemplary process for fractional decimation of a parallelized serial signal.
Figure 6B:
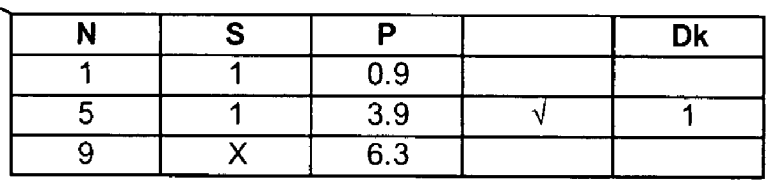
Figure 6C:
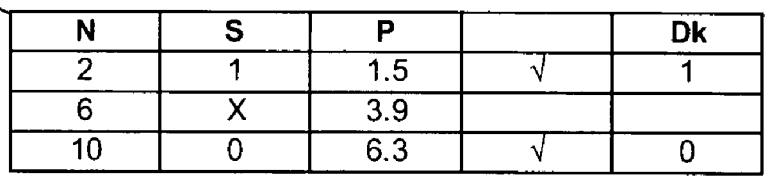
Figure 6D:
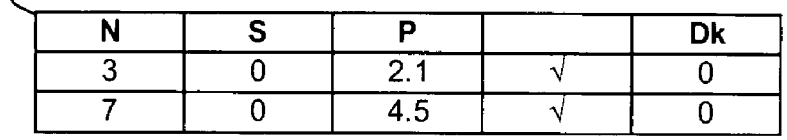

In the example described in reference to FIGS. 5A-5C, position "P" is computed by adding 0.6 to the position of the previous sample. For example, to process four samples at a time, four substantially parallel circuits may be implemented to advance position four times faster than a single circuit. In the tables illustrated by FIGS. 6A-6D, the position numbers "P" are the same as those illustrated in FIG. 5C but rearranged into the four parallel circuits. For example, the first sample taken (e.g., the sample taken at N=0) is being processed by a first fractional decimator, and the data being processed by the first fractional decimator is illustrated by the table 602 of FIG. 6A. The second sample taken (e.g., the sample taken at N=1) is processed by a second fractional decimator, the data of which is illustrated by the table 604 of FIG. 6B. FIG. 6C illustrates the table 606 of data being processed by a third fractional decimator, and this data includes the third sample taken (e.g., the sample taken at N=2). FIG. 6D illustrates the table 608 of data being processed by a third fractional decimator, and this data includes the fourth sample taken (e.g., the sample taken at N=3). The table 602 illustrates that the first fractional decimator, in some embodiments, may process the first data sample and every fourth data sample thereafter (e.g., samples taken at 4N, such as 0, 4, 8 . . . ). The table 604 illustrates that the second fractional decimator, in some embodiments, may process the second data sample and every fourth sample thereafter offset by one (e.g., samples taken at 4N+1, such as 1, 5, 9 . . . ). Likewise, in some embodiments, the third fractional decimator may process samples taken at 4N+2, and the fourth parallel decimator may process samples taken at 4N+3. Although the previous example described the use of four fractional decimators for illustration, any number of two or more fractional decimators may be implemented.

In some embodiments, some or all of the fractional decimators may be configured to receive sampled data in a substantially parallel manner. For example, some or all of the fractional decimators may each be provided with a data sample in a single clock cycle. In some embodiments, some of the fractional decimators may be configured to receive sampled data in a substantially sequential manner. For example, the sampler and ADC module 301 illustrated in FIG. 3 may be capable of sampling data at a rate that is ten times faster than the rate at which a single fractional decimator can process a single point of data. In this case, ten or more fractional decimators may be implemented, where the first fractional decimator may receive a first sample of data during a first clock cycle, the second fractional decimator may receive a second sample during a second clock cycle, and the remaining fractional decimators may each individually receive subsequent samples of data during subsequent clock cycles in a substantially cyclical (e.g., "round-robin") manner. In some embodiments, parallel fractional decimators may be configured to operate in series, parallel, in sequence, or in various combinations thereof.

In some embodiments, data may be distributed among multiple decimators in a dynamically balanced manner. For example, the decimators may be capable of providing an indication (e.g., signaling the de-serializer module 335 and/or the processor module 320) of their availabilities (e.g., load statuses), and data may be distributed to decimators based upon decimator availability. In some implementations, the first and second decimators may both receive an identical number of data samples to process, but the first decimator may complete the task faster than the second decimator (for example, the computations required to decimate the first decimator's data may not be as computationally complex and therefore may not require as many clock cycles as the computations performed by the second decimator). In this case, the first decimator may indicate to the de-serializer module 335 and/or the processor module 320 that the first decimator is available to accept additional data, and the de-serializer module 335 may respond by dynamically distributing additional data to the first decimator, or to any decimator that may indicate that it is available to process additional data.

In some embodiments, parallel decimation may be implemented in a dynamically scaled manner. For example, the de-serializer 335 may distribute data to only the first decimator until the first decimator is operating at maximum capacity (e.g., the data rate matches or exceeds the decimation rate, or the decimator indicates that it is operating at or near maximum capacity), and the de-serializer module 335 may react by distributing the excess samples to the second decimator. In some embodiments, the process of distributing data in a dynamically scaled manner may implement two or more decimators. In some embodiments, data may be distributed among decimators in a dynamically balanced manner, a dynamically scaled manner, a non-dynamic manner, or combinations thereof.

In some implementations, the Min-Max operation may not be dependent on the decimation method. For example, once the decimation circuit, fractional or otherwise, may identify the samples, the transfer of data to the output stream may include the min-max operation if required. In some embodiments, the parallel decimation process may perform two or more parallel fractional decimation processes, two or more parallel integer decimation processes, or combinations of parallel integer and/or fractional decimation processes.

Although various implementations have been described, further embodiments and features are contemplated. For example, fractional decimation may be incorporated into various test and measurement equipment to convert data rates and/or reduce the number of samples in an over-sampled system. Exemplary equipment may include, but is not limited to, oscilloscopes (e.g., sampling, digital storage), logic analyzers, spectrum analyzers, protocol analyzers, signal analyzers (e.g., for audio, video, optical, radio frequency signals, and the like), data compression (e.g., for storage, transmission, and the like), data rate converters, or other equipment that processes over-sampled data. Although various examples have referred to one-bit sampling, that is not a limitation, as various embodiments may be adapted for multiple-bit sampling. Some implementations of a fractional decimator module (e.g., including hardware and/or firmware or software) may be adapted to be retrofit into equipment to accommodate, for example, increases in data rates, without requiring a corresponding increase in data storage capacity.

Various embodiments may implement real-time processing of incoming samples of serial data, post-processing, or a combination thereof. Digital feedback may be implemented to compensate for phase variations in the incoming serial data stream.

Various embodiments may include aspects of a computer. The essential elements of a computer are a processor for executing instructions and one or more memories for storing instructions and data. Suitable processors for the execution of a program of instructions include, by way of example, both general and special purpose microprocessors, which may include a single processor, or multiple processors in combination. The processor and the memory can be supplemented by, or incorporated in, ASICs (application-specific integrated circuits). Generally, a processor will receive instructions and data from a data store, such as a read-only memory (ROM), a random access memory (RAM), or both.

Generally, a computer will also include, or be operatively coupled to communicate with, one or more mass storage devices for storing data files. Storage devices suitable for tangibly embodying computer program instructions and data may include volatile and/or non-volatile memory (NVM), which may include, but is not limited to, semiconductor memory devices (e.g., RAM, EPROM, EEPROM, NAND flash, NOR flash, thumb drives), magnetic disks (e.g., hard disc drives), magneto-optical and/or optical media (e.g., CD, DVD).

In some implementations, one or more user-interface features may be custom configured to perform specific functions. Various embodiments may be implemented in a computer system that includes a graphical user interface and/or an Internet browser. To provide for interaction with a user, some implementations may be implemented on a computer having a display device, such as a CRT (cathode ray tube) or LCD (liquid crystal display) monitor for displaying information to the user, a keyboard, and a pointing device, such as a mouse, stylus, or a trackball by which the user can provide input to the computer.

In various embodiments, systems such as the serial waveform processing system 105 may communicate using suitable communication methods, equipment, and techniques. For example, the serial waveform processing system 105 may communicate with a portable computer, network server, or other device using point-to-point communication in which a message is transported directly from the source to the receiver over a dedicated physical link (e.g., fiber optic link, point-to-point wiring, and daisy-chain). Other embodiments may transport messages by broadcasting to all or substantially all devices that are coupled together by a communication network, for example, by using omni-directional radio frequency (RF) signals, while still other embodiments may transport messages characterized by high directivity, such as RF signals transmitted using directional (i.e., narrow beam) antennas or infrared signals that may optionally be used with focusing optics. Still other embodiments are possible using appropriate interfaces and protocols such as, by way of example and not intended to be limiting, RS-232, RS-422, RS-485, 802.11a/b/g, Wi-Fi, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In some embodiments, each memory may be programmed with the same information and be initialized with substantially identical information stored in non-volatile memory. In other embodiments, one or more devices may be custom configured to perform specific functions.

A number of implementations have been described. Nevertheless, it will be understood that various modifications may be made without departing from the spirit and scope. For example, advantageous results may be achieved if the steps of the disclosed techniques were performed in a different sequence, if components in the disclosed systems were combined in a different manner, or if the components were replaced or supplemented by other components. The functions and processes (including algorithms) may be performed in hardware, software, or a combination thereof, and some implementations may be performed on modules or hardware not identical to those described. Accordingly, other implementations are within the scope of the following claims.

What is claimed is:

1. A method of operating a waveform processing system to reduce a number of samples in a data sequence that represents an over-sampled waveform, the method comprising:
    receiving a sequence of sampled values for at least one data period of a serial data waveform, the sequence of sampled values having a substantially fixed sample period, wherein a ratio of the data period to a sample period of the sequence of samples is greater than one;
    selecting a reference position within each data period;
    for each of the at least one data periods, identifying a sample in the sequence of samples that is substantially closest to the selected reference position within the data period; and
    reconstructing at least a portion of the serial data waveform using the identified samples, the reconstructed waveform comprising fewer samples than the number of samples in the received sequence of sampled values.

2. The method of claim 1, wherein the ratio of the data period to the sample period is approximately a ratio of integers.

3. The method of claim 1, wherein the reference time comprises a substantially optimal time within each data period to sample the original waveform.

4. The method of claim 1, wherein the reference time is positioned approximately in the center of each data period.

5. The method of claim 1, wherein identifying a sample in the sequence of samples that is substantially closest to the selected reference position within the data period comprises identifying one sample in each of the at least one data periods.

6. The method of claim 1, further comprising dynamically updating a selection range around the reference position and encompassing the identified sample.

7. The method of claim 6, further comprising dynamically updating the selection range in response to information indicative of a change in the data period.

8. The method of claim 7, wherein the selection range is based on the ratio of the data period to the sample period.

9. The method of claim 1, wherein the sample period is determined by a sample clock signal having a substantially fixed frequency.

10. The method of claim 1, further comprising substantially tracking a phase of the serial data waveform.

11. The method of claim 10, wherein substantially tracking a phase of the serial data waveform comprises advancing or retarding a phase of the decimation.

12. The method of claim 10, wherein substantially tracking a phase of the serial data waveform comprises phase shifting the serial waveform and identifying a sample in the sequence of samples that is substantially closest to the selected reference position within the data period.

13. The method of claim 1, further comprising determining a data rate of the serial data waveform.

14. A method of operating a waveform processing system to decimate a data sequence that represents an over-sampled waveform, the method comprising:
    receiving a sequence of sampled values for at least one data period of a serial data waveform, the sequence of sampled values having a sample period, wherein a quotient of the data period and a sample period of the sequence of samples is approximately a ratio of integers, the ratio being greater than one;
    determining a timing position for each of a plurality of sampled values in the sequence of sampled values, each of the timing positions comprising a fractional portion representing a timing position of the sampled value within one of the plurality of data periods;
    for each of the at least one data periods, identifying one sample in the sequence of samples that is substantially closest to a selected timing position within the data period, the identification being based upon the fractional portion of the timing position for the identified sample; and
    reconstructing at least a portion of the serial data waveform using the identified samples, the reconstructed waveform comprising fewer samples than the number of samples in the received sequence of sampled values.

15. The method of claim 14, wherein the identifying step comprises comparing the fractional portion of the sampled values to the selected timing position within the data period.

16. The method of claim 15, wherein comparing the fractional portion of the sampled values to the selected timing position within the data period comprises determining that the sampled value is closest to the selected timing position if the fractional portion of the sample's timing position meets at set of at least one boundary conditions that are a function of the ratio of the sample period.

17. The method of claim 14, wherein the sample period is determined by a sample clock signal having a substantially fixed frequency.

18. A waveform processing system configured to reduce a number of samples in a data sequence that represents an over-sampled waveform, the system comprising:
   a module to receive a sequence of sampled values for at least one data period of a serial data waveform, the sequence of sampled values having a substantially fixed sample period, wherein a ratio of the data period to a sample period of the sequence of samples is greater than one;
   a processor operatively coupled to the module and adapted to perform the following operations on the sequence of sampled values:
   select a reference position within each data period;
   for each of the at least one data periods, identify a sample in the sequence of samples that is substantially closest to the selected reference position within the data period; and
   reconstruct at least a portion of the serial data waveform using the identified samples, the reconstructed waveform comprising fewer samples than the number of samples in the received sequence of sampled values.

19. The system of claim 18, wherein the system comprises an oscilloscope.

20. The method of claim 18, further comprising a module to substantially track a phase of the serial data waveform.

* * * * *